(12) United States Patent
Hwang et al.

(10) Patent No.: US 7,160,814 B2
(45) Date of Patent: Jan. 9, 2007

(54) METHOD FOR FORMING CONTACT IN SEMICONDUCTOR DEVICE

(75) Inventors: Chang-Youn Hwang, Ichon-shi (KR);
Bong-Ho Choi, Ichon-shi (KR);
Jung-Geun Kim, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/882,698

(22) Filed: Jun. 29, 2004

(65) Prior Publication Data

US 2005/0153535 A1    Jul. 14, 2005

(30) Foreign Application Priority Data

Jan. 13, 2004    (KR) .................... 10-2004-0002305

(51) Int. Cl.
*H01L 21/461* (2006.01)
(52) U.S. Cl. ................. 438/717; 257/E21.023
(58) Field of Classification Search ........ 438/704, 438/717, 618, 719; 257/E21.023
See application file for complete search history.

(56) References Cited

U.S. PATENT DOCUMENTS

| 6,579,753 | B1 | 6/2003 | Yamanobe |
| 6,699,749 | B1 | 3/2004 | Lee et al. |
| 2003/0129847 | A1* | 7/2003 | Celii et al. ................ 438/706 |
| 2004/0058496 | A1* | 3/2004 | Lee ............................ 438/258 |
| 2004/0058522 | A1* | 3/2004 | Lee et al. ................... 438/618 |

* cited by examiner

*Primary Examiner*—Bradley K. Smith
(74) *Attorney, Agent, or Firm*—Blakely Sokoloff Taylor & Zafman (57) ABSTRACT

Disclosed is a method for forming a contact in a semiconductor device. The method includes the steps of: forming a bit line on a substrate; forming an oxide layer made of high density plasma (HDP) oxide on a substrate structure including the bit line and the substrate; forming a hard mask on the oxide layer; and performing an etching process for forming a storage node contact, wherein the etching process is performed after the bit line, the oxide layer and the hard mask are formed with a predetermined thickness and a predetermined tensile stress such that a total compressive stress value of the bit line, the oxide layer and the hard mask layer is less than a critical value of a lifting phenomenon.

15 Claims, 7 Drawing Sheets

METHOD FOR FORMING CONTACT IN SEMICONDUCTOR DEVICE

FIELD OF THE INVENTION

The present invention relates to a method for fabricating a semiconductor device; and, more particularly, to a method for forming a contact in a semiconductor device capable of preventing a lifting phenomenon caused by a compressive stress difference between layers for forming a storage node contact.

DESCRIPTION OF RELATED ARTS

Generally, as a semiconductor device has been highly integrated, a distance between patterns and a thickness of a photoresist have been decreased. This decreased thickness of the photoresist impairs the function of the photoresist as a mask used when an oxide layer or any other type of a layer is etched in the course of forming a contact hole having a high aspect ratio, or a self-aligned contact hole.

To solve this problem of the impaired function of the photoresist, it is necessary to form a hard mask capable of providing the photoresist having a high etch selectivity to the oxide layer, or to any other type of a layer.

At this time, if the hard mask is formed by using silicon nitride, a silicon nitride layer containing less hydrogen content has a higher thermal expansion coefficient than that of silicon when the silicon nitride layer is deposited by employing a low pressure chemical vapor deposition (LP-CVD) method with use of a furnace.

Thus, after the silicon nitride layer is deposited at a high temperature and is then cooled down at a room temperature, the silicon nitride layer possesses a high tensile stress with respect to bottom layers including a silicon substrate. Hence, after an etching process for forming a gate electrode structure, or a subsequent thermal process, there is a frequent case that the gate electrode structure becomes lifted upwardly, or a middle portion of the gate electrode structure becomes cracked.

These abnormal phenomena are observed more frequently when metal silicide having a higher tensile stress than that of silicon is used as a lower electrode material, or when a thermal process is carried out at a higher deposition temperature than that of the silicon nitride layer.

Meanwhile, a silicon nitride layer deposited by employing a chemical vapor deposition (CVD) method using a plasma is formed through a vapor reaction instigated with a support of a plasma at a temperature ranging from 400° C. to 500° C. In this case, the silicon nitride layer formed by the CVD method has different composition and properties from the silicon nitride layer deposited by the LP-CVD method. For instance, the silicon nitride layer formed by the CVD method contains much higher hydrogen content than the silicon nitride layer deposited by the LP-CVD method. Thus, the silicon nitride layer deposited by the CVD method has a lower compressive stress with respect to silicon, resulting in a less frequent occurrence of the above mentioned abnormal phenomena.

However, compared with the silicon nitride layer deposited by the LP-CVD method, the silicon nitride layer deposited by the CVD method may induce generation of defective patterns, or an electric short between the gate electrodes caused by an impaired function of the silicon nitride layer as an insulating layer between the gate electrodes.

To solve these problems, one proposed approach is to increase a thickness of a silicon nitride layer used as a hard mask. This increased thickness of the silicon nitride layer makes it possible to augment a resistance of the silicon nitride layer to an etching process. However, an etch-targeted height of the gate electrode is also proportionally increased and thus, there is a difficulty in proceeding an etching process for forming the gate electrodes and in proceeding a subsequent gap-filling process, a photo-exposure process and a planarization process due to a height difference between the gate electrode structures pronounced after the etching process.

Figure 1A:
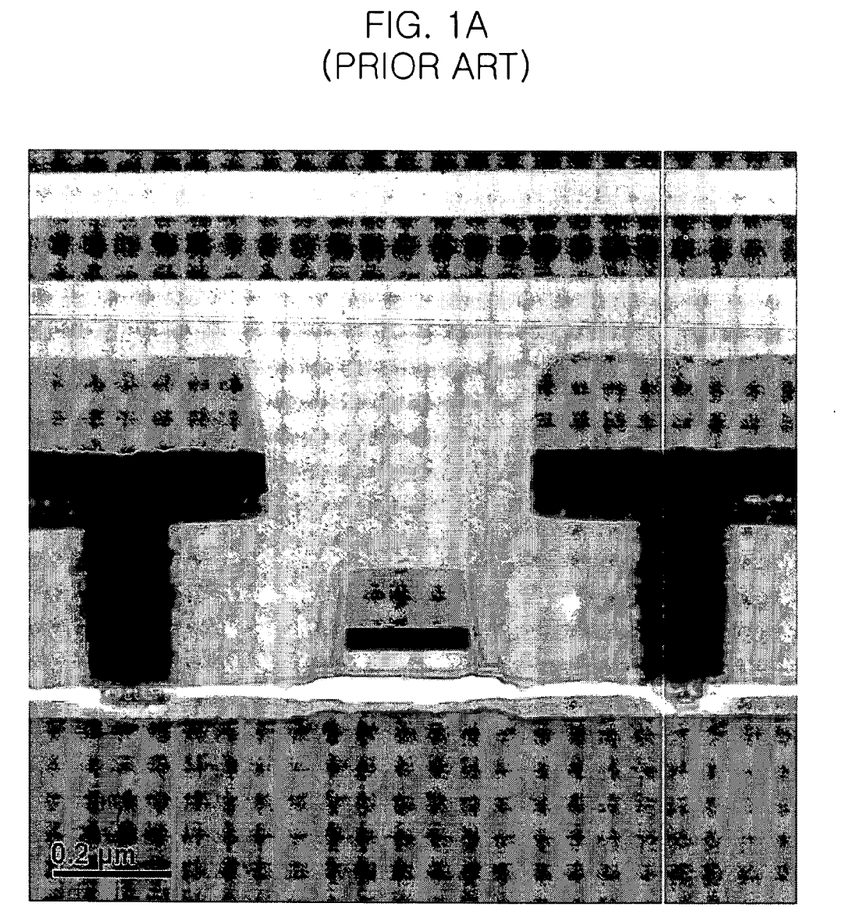
FIGS. 1A to 1B are micrographs of scanning electron microscopy (SEM) depicting a full lifting of a conventional stack structure for forming a contact.
Figure 1B:
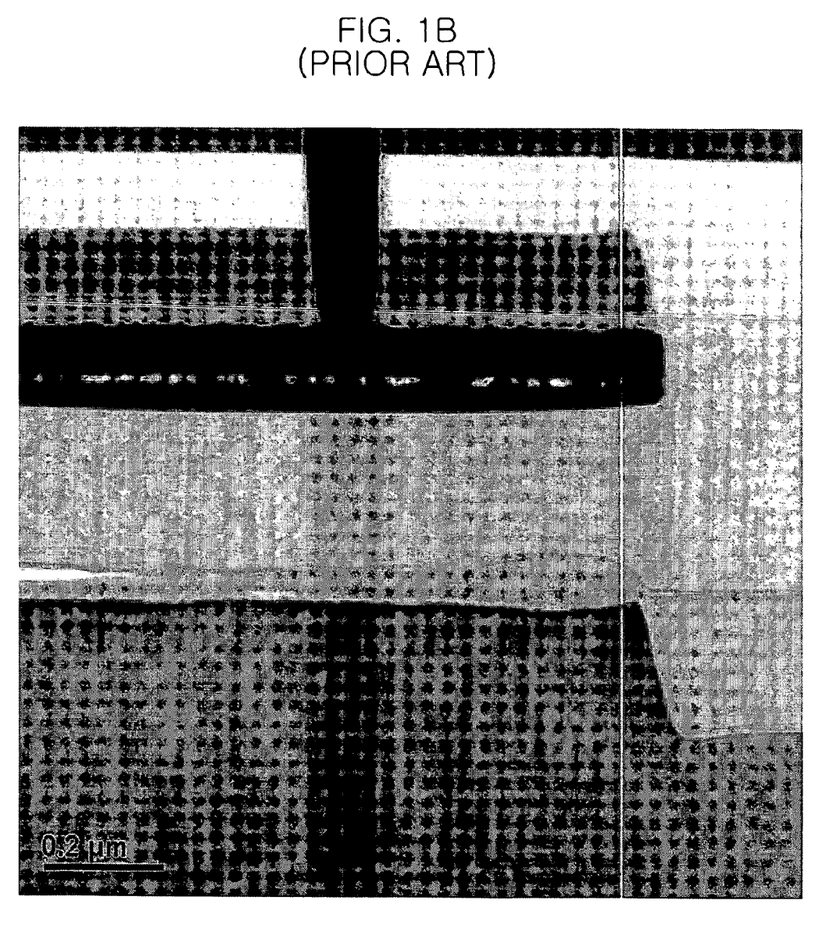

FIGS. 1A and 1B are micrographs of scanning electron microscopy (SEM) depicting a lifting phenomenon of a stack structure for forming a storage node contact. Particularly, FIGS. 1A and 1C show the fully lifted stack structure.

Herein, the stack structure includes an inter-layer dielectric (ILD) layer, a hard mask, a buffer oxide layer, a spacer, and a plug. The ILD layer, the hard mask, the buffer oxide layer, the spacer, and the plug are made of high density plasma (HDP) oxide, plasma enhanced nitride, undoped silicate glass (USG), low pressure nitride, and polysilicon, respectively.

As shown in FIGS. 1A and 1B, abnormality in the above stacked layers appearing in edges of an active region is observed in a whole region. That is, a region where the lifting phenomenon occurs becomes extended, further indicating that a damage region created by a focused ion beam (FIB) device appears consecutively.

Figure 2:
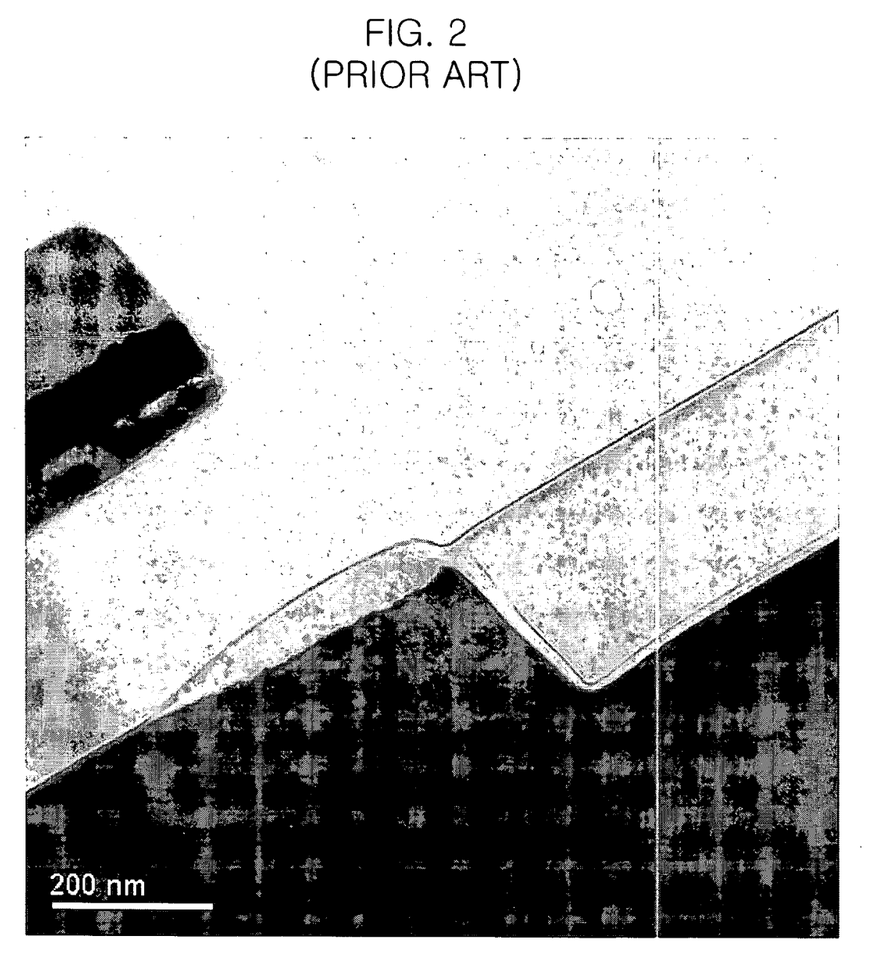
FIG. 2 is a micrograph of SEM depicting a partial lifting of a conventional stack structure in a split test.

FIG. 2 is a micrograph of SEM depicting a partially lifted stack structure in a split test. Particularly, FIG. 2A shows the partial lifting of the stack structure attributable to a weak damage created by a FIB device.

Herein, the stack structure also includes an inter-layer dielectric (ILD) layer, a hard mask, a buffer oxide layer, a spacer, and a plug. The ILD layer, the hard mask, the buffer oxide layer, the spacer, and the plug are made of high density plasma (HDP) oxide, plasma enhanced nitride, undoped silicate glass (USG), low pressure nitride, and polysilicon, respectively.

In a highly integrated device such as an 80 nm semiconductor device, a problem of an insufficient thickness of a photoresist for forming a contact hole is solved through the application of a hard mask and a buffer oxide layer. However, the use of the hard mask may induce a stress, which in turn, causes a target structure to be lifted. This lifting phenomenon may further result in a device failure.

SUMMARY OF THE INVENTION

It is, therefore, an object of the present invention to provide a method for forming a contact in a semiconductor device capable of preventing a target layer from being lifted due to a compressive stress difference between the target layers by forming the target layers for forming the contact with a different stack structure.

In accordance with an aspect of the present invention, there is provided a method for forming a contact in a semiconductor device, including the steps of: forming a bit line on a substrate; forming an oxide layer made of high density plasma (HDP) oxide on a substrate structure including the bit line and the substrate; forming a hard mask on the oxide layer; and performing an etching process for forming a storage node contact, wherein the etching process is performed after the bit line, the oxide layer and the hard mask are formed with a predetermined thickness and a predetermined tensile stress such that a total compressive stress value of the bit line, the oxide layer and the hard mask layer is less than a critical value of a lifting phenomenon.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A method for forming a contact in a semiconductor device in accordance with a preferred embodiment of the present invention will be described in detail with reference to the accompanying drawings.

It is contrived in the preferred embodiment of the present invention to solve a problem of a lifting phenomenon resulted from a difference in stress between target layers by forming the target layers with a different stack structure stable to the stress.

It is noted that the lifting phenomenon occurs when a value of a stress intensity factor (Kc) is greater than a critical value (Kic) in which the lifting phenomenon is induced. Also, a lifting in the shape of a coin is induced by a pronounced compressive stress of the overall stack structure. That is, the lifting in the shape of a coin can be regarded as a buckling caused by a compressive stress.

More specifically, the stress intensity factor (Kc) can be expressed as follows.

$$Kc = \sigma \mathit{thk} \quad \text{Equation 1}$$

Herein, reference denotations 'σ' and 'thk' express a stress from a layer of a stack structure and a thickness of the layer of the stack structure. A value of the stress intensity factor (Kc) of each layer is calculated, and these calculated values are added together to obtain the total stress intensity factor (Kc) value of the stack structure.

As the total stress intensity factor (Kc) value is more positive, the stack structure becomes much free from a coin-shaped lifting. Therefore, as indicated in the given equation 1, an incidence of the lifting phenomenon can be suppressed by controlling a stress from the stack structure and a thickness of a target layer of the stack structure.

Table 1 provided below shows stress intensity factor (Kc) values of layers of a stack structure for forming a storage node contact (SNC). Particularly, a buffer oxide layer and a hard mask of the stack structure are made of undoped silicate glass (USG) and plasma enhanced nitride, respectively.

TABLE 1

| Layers of Stack Structure | Thickness (Å) | Stress (dyn/cm$^2$) | Kc (Mpa/m$^{-1/2}$) | Kc$_{total}$ (Mpa/m$^{-1/2}$) |
| --- | --- | --- | --- | --- |
| SNC Sp LP_Nit | 185 | 1.16E+10 | 0.230 | −0.157 |
| SNC BO USG | 520 | −3.00E+09 | −0.100 | |

TABLE 1-continued

| Layers of Stack Structure | Thickness (Å) | Stress (dyn/cm$^2$) | Kc (Mpa/m$^{-1/2}$) | Kc$_{total}$ (Mpa/m$^{-1/2}$) |
| --- | --- | --- | --- | --- |
| SNC HM PE_Nit | 1100 | −2.66E+09 | −0.129 | |
| ILD2 HDP | 3100 | −2.00E+09 | −0.163 | |
| ILD1 B BPSG | 1200 | −3.00E+08 | −0.015 | |
| ILD1 A LP_TEOS | 2000 | 2.95E+08 | 0.019 | |

As shown, the total of the stress intensity factor (Kc) values indicates that the stack structure does not have stability to the lifting.

Table 2 provided below shows the stress intensity factor (Kc) values of a stack structure including the same layers described in Table 1 except that a buffer oxide layer and a hard mask are made of undoped silicate glass (USG) and plasma enhanced nitride, respectively.

TABLE 2

| Layers of Stack Structure | Thickness (Å) | Stress (dyn/cm$^2$) | Kc (Mpa/m$^{-1/2}$) | Kc$_{total}$ (Mpa/m$^{-1/2}$) |
| --- | --- | --- | --- | --- |
| SNC Sp LP_Nit | 185 | 1.16E+10 | 0.230 | −0.057 |
| SNC BO USG | 0 | −3.00E+09 | 0.000 | |
| SNC HM PE_Nit | 1100 | −2.66E+09 | −0.129 | |
| ILD2 HDP | 3100 | −2.00E+09 | −0.163 | |
| ILD1 B BPSG | 1200 | −3.00E+08 | −0.015 | |
| ILD1 A LP_TEOS | 2000 | 2.95E+08 | 0.019 | |

As shown, the total of the stress intensity factor (Kc) values expresses that the stack structure does not also have stability to the lifting.

Table 3 provided below shows stress intensity factor (Kc) values of a stack structure including the same layers described in Table 1 except that a buffer oxide layer made of undoped silicate glass (USG) is not used and a hard mask is made of polysilicon.

TABLE 3

| Layers of Stack Structure | Thickness (Å) | Stress (dyn/cm$^2$) | Kc (Mpa/m$^{-1/2}$) | Kc$_{total}$ (Mpa/m$^{-1/2}$) |
| --- | --- | --- | --- | --- |
| SNC Sp LP_Nit | 185 | 1.16E+10 | 0.230 | 0.198 |
| SNC BO USG | 0 | −3.00E+09 | 0.000 | |
| SNC HM Poly | 900 | 2.89E+09 | 0.127 | |
| ILD2 HDP | 3100 | −2.00E+09 | −0.163 | |
| ILD1 B BPSG | 1200 | −3.00E+08 | −0.015 | |
| ILD1 A LP_TEOS | 2000 | 2.95E+08 | 0.019 | |

As shown, the total of the stress intensity factor (Kc) values indicates that the stack structure has stability to the lifting.

Table 4 provided below shows stress intensity factor (Kc) values of a stacked structure including the same layers described in Table 1 except that a hard mask for forming a SNC is not used.

TABLE 4

| Layers of Stack Structure | Thickness (Å) | Stress (dyn/cm$^2$) | Kc (Mpa/m$^{-1/2}$) | Kc$_{total}$ (Mpa/m$^{-1/2}$) |
| --- | --- | --- | --- | --- |
| SNC Sp LP_Nit | 185 | 1.16E+10 | 0.230 | −0.028 |
| SNC BO USG | 520 | −3.00E+09 | −0.100 | |

TABLE 4-continued

| Layers of Stack Structure | Thickness (Å) | Stress (dyn/cm$^2$) | Kc (Mpa/m$^{-1/2}$) | Kc$_{total}$ (Mpa/m$^{-1/2}$) |
|---|---|---|---|---|
| SNC HM | 0 | −2.66E+09 | 0.000 | |
| ILD2 HDP | 3100 | −2.00E+09 | −0.163 | |
| ILD1 B BPSG | 1200 | −3.00E+08 | −0.015 | |
| ILD1 A LP_TEOS | 2000 | 2.95E+08 | 0.019 | |

As indicated by the total of the stress intensity factor (Kc) value of the stacked layers, the stack structure is susceptible to the lifting when the hard mask layer is not formed.

Table 5 provided below shows stress intensity factor (Kc) values of a stack structure including the same layers described in Table 1 except that a buffer oxide layer and a hard mask are not used.

TABLE 5

| Layers of Stack Structure | Thickness (Å) | Stress (dyn/cm$^2$) | Kc (Mpa/m$^{-1/2}$) | Kc$_{total}$ (Mpa/m$^{-1/2}$) |
|---|---|---|---|---|
| SNC Sp LP_Nit | 185 | 1.16E+10 | 0.230 | 0.072 |
| SNC BO USG | 0 | −3.00E+09 | 0.000 | |
| SNC HM | 0 | −2.66E+09 | 0.000 | |
| ILD2 HDP | 3100 | −2.00E+09 | −0.163 | |
| ILD1 B BPSG | 1200 | −3.00E+08 | −0.015 | |
| ILD1 A LP_TEOS | 2000 | 2.95E+08 | 0.019 | |

As shown, the total of the stress intensity factor (Kc) values indicates that the stack structure has stability to the lifting. However, as mentioned above, since the total stress intensity factor (Kc) value in Table 5 is less than that in Table 3, the stack structure without the hard mask has a weak stability to the lifting than the stack structure described in Table 3 does.

Hereinafter, a method for forming a storage node contact in a semiconductor device will be described in accordance with the preferred embodiment.

Figure 3A:
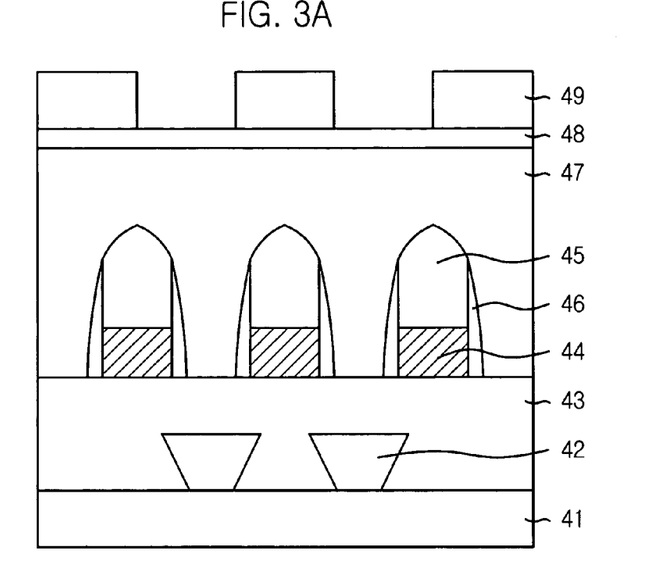
FIGS. 3A to 3C are cross-sectional views showing a method for forming a contact in a semiconductor device in accordance with a preferred embodiment of the present invention.
Figure 3B:
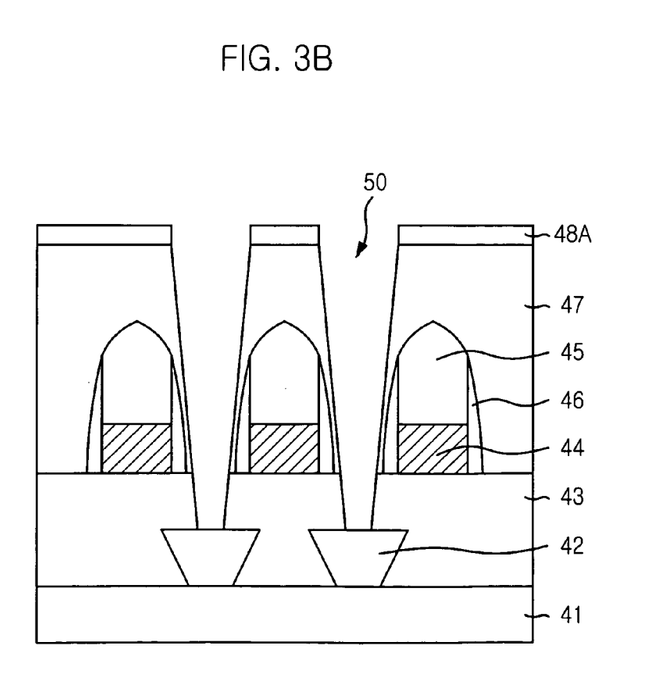
Figure 3C:
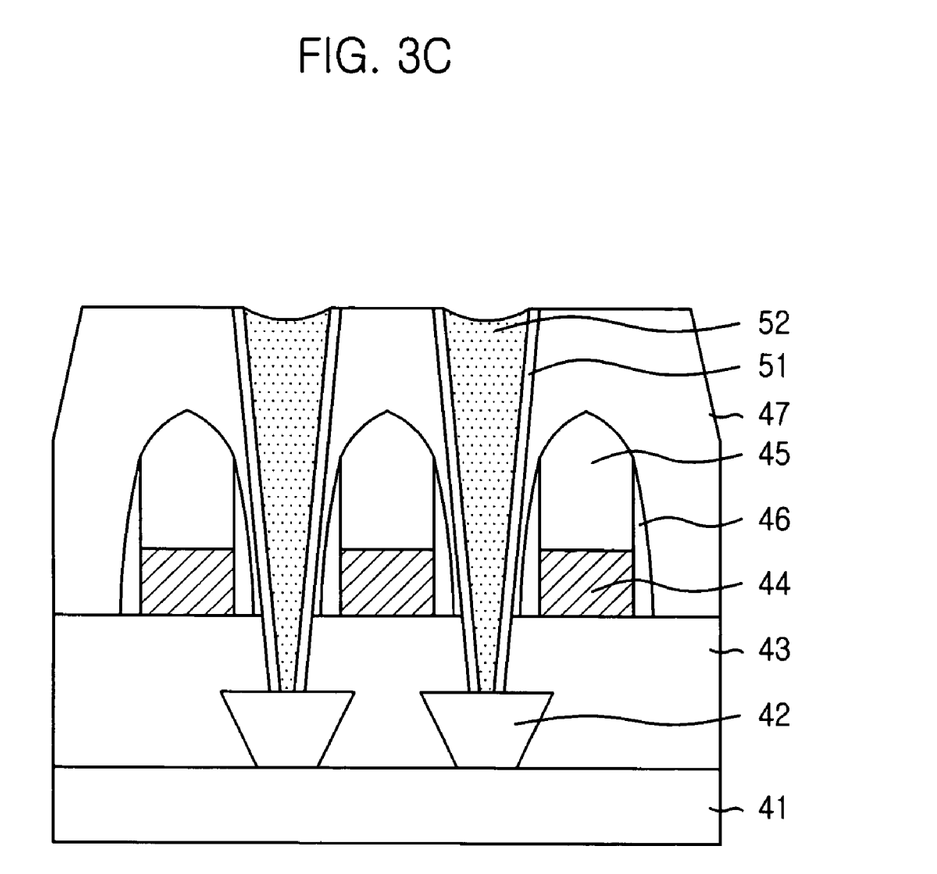

FIGS. 3A and 3C are cross-sectional views showing a method for forming a storage node contact having a stack structure in a semiconductor device in accordance with the preferred embodiment of the present invention.

Referring to FIG. 3A, a bottom pattern 42 and an inter-layer insulation layer 43 are formed on a substrate 41. A bit line material and a bit line hard mask material are formed on the inter-layer insulation layer 43 and are selectively patterned to form a plurality of bit lines 44 and a plurality of bit line hard masks 45.

Although not illustrated, a bit line barrier metal layer of Ti and TiN is formed on the inter-layer insulation layer 43 in the course of forming the plurality of bit lines 44. In this case, a thickness of the bit line barrier metal layer ranges from approximately 100 Å to approximately 1000 Å.

Also, in case that tungsten is used as the bit line material, the bit line material is formed with a thickness ranging from approximately 300 Å to approximately 1000 Å. An etching process for forming the bit lines 44 proceeds under a pressure of approximately 20 mTorr to approximately 70 mTorr and a power of approximately 300 W to approximately 1000 W by using an etch gas of SF$_6$, BCl$_3$, N$_2$ and Cl$_2$.

The bit line hard mask 45 is made of nitride and has a thickness ranging from approximately 2000 Å to approximately 4000 Å. An etching process for forming the bit line hard masks 45 proceeds under a pressure of approximately 20 mTorr to approximately 70 mTorr and a power of approximately 300 W to approximately 1000 W by using an etch gas of CF$_4$, CHF$_3$, O$_2$ and Ar.

Next, a nitride layer for forming a bit line spacer is formed on the above resulting substrate structure, and then, an etching process and a cleaning process are performed to form a bit line spacer 46 on sidewalls of each bit line structure including the bit line 44 and the bit line hard mask 45. Herein, the nitride layer has a thickness ranging from approximately 50 Å to approximately 150 Å.

Afterwards, an interlayer dielectric (ILD) layer 47 for insulating the above bit lines 44 is formed on the resulting substrate structure. Herein, the interlayer dielectric (ILD) layer 47 is formed by using HDP oxide and has a thickness ranging from approximately 5000 Å to approximately 10000 Å. Thereafter, a polysilicon layer 48 for forming a hard mask for use in a storage node contact is formed on the interlayer dielectric layer 47.

Then, a storage node contact mask 49 is formed by performing a series of processes including a key open mask, a key opening etch process, a photoresist stripping process, and a cleaning process.

Referring to FIG. 3B, the polysilicon layer 48 shown in FIG. 3A is patterned by another etching process, thereby obtaining a hard mask 48A. Then, the storage node contact mask 49 is removed thereafter. The interlayer dielectric layer 47 is etched with use of the hard mask 48A to form a plurality of storage node contact holes 50.

At this time, the etching process for forming the hard mask 48A is performed by using an etch gas of C$_2$F$_6$, HBr, Cl$_2$, Ar and He. Also, the etching process proceeds under a pressure ranging from approximately 5 mTorr to approximately 20 mTorr and a power ranging from approximately 80 W to approximately 500 W.

Also, for the etching process for forming the storage node contact holes 50, an etch gas of C$_4$F$_8$, C$_5$F$_8$, C$_4$F$_6$, CH$_2$F$_2$, Ar, O$_2$, Co and N$_2$ is used. This etching process proceeds under a pressure ranging from approximately 15 mTorr to approximately 50 mTorr and a power ranging from approximately 1000 W to approximately 2000 W.

In addition, after the storage node contact mask 49 is removed, a cleaning process is carried out to remove polymers produced from the above etching processes. At this time, the cleaning process uses a mixed solution of H$_2$SO$_4$ and H$_2$O$_2$, or buffered oxide etchant (BOE) obtained by mixing HF and NH$_4$F in a ratio of approximately 1 to approximately 300.

Referring to FIG. 3C, a low pressure nitride layer for forming a spacer is formed on the storage node contact holes 50. At this time, the low pressure nitride layer has a thickness ranging from approximately 100 Å to approximately 500 Å. Then, the low pressure nitride layer is subjected to an etching process and a cleaning process, thereby obtaining a spacer 51 on lateral sides of the storage node contact holes 50. Herein, an etch gas of CF$_4$, CHF$_3$, Ar and O$_2$ is used in the etching process for forming the spacer 51. Also, the etching process proceeds under a pressure ranging from approximately 30 mTorr to approximately 60 mTorr and a power ranging from approximately 1000 W to approximately 1800 W.

Subsequent to the formation of the spacer 51, a storage node contact plug material is formed with a thickness ranging from approximately 1500 Å to approximately 3000 Å. Herein, the storage node contact plug material is polysilicon. The storage node contact plug material is etched back to form a plurality of storage node contact plugs 52. Also, in the course of performing the etch-back process for forming the storage node contact plugs 52, the hard mask 48A remaining in a cell region and a peripheral circuit region is removed.

Figure 4A:
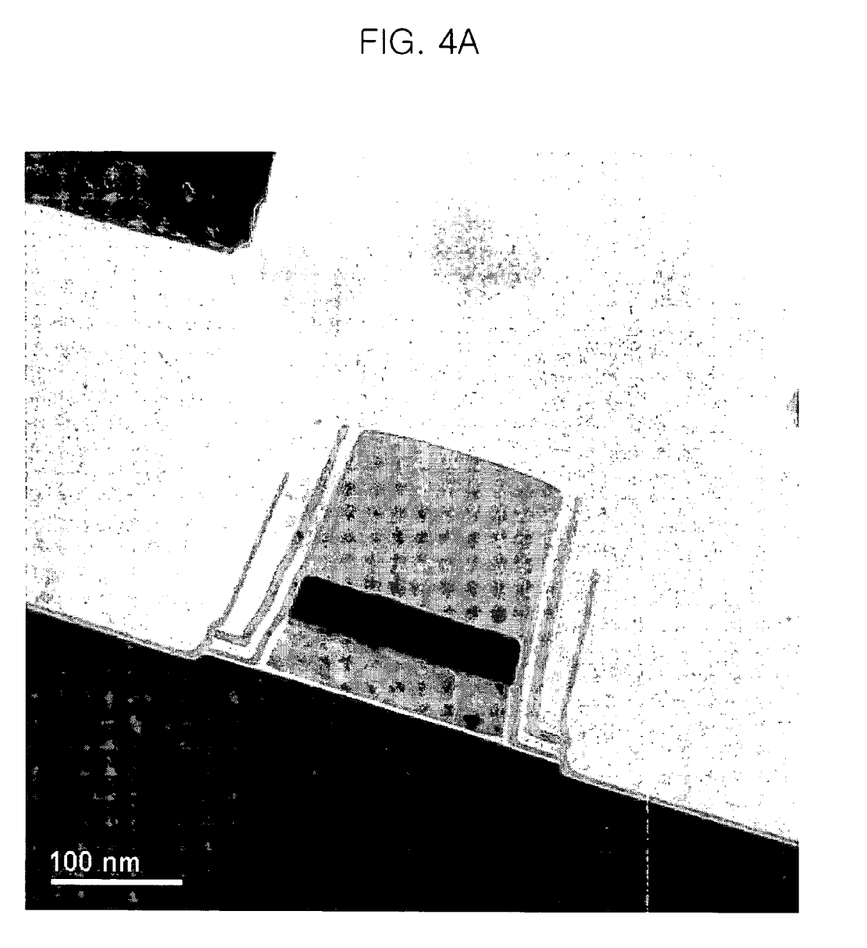
FIGS. 4A and 4B are micrographs of SEM showing a stack structure free from a lifting phenomenon in accordance with the preferred embodiment of the present invention.
Figure 4B:
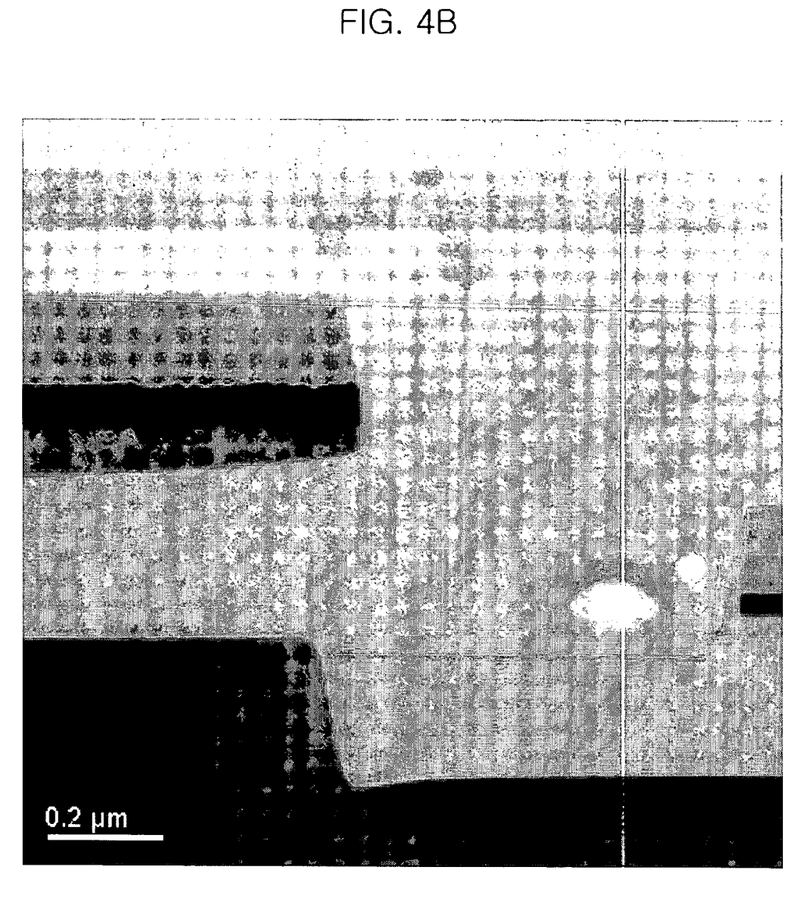

According to the preferred embodiment of the present invention, in a semiconductor device having a linewidth of approximately 80 nm, because of a decrease in a thickness of the photoresist, the hard mask is employed when the storage node contacts are formed. Also, those stacked layers for forming the storage node contacts are formed in a careful consideration of a tensile stress. As a result, it is possible to solve the problem of lifting caused by a difference between stresses of the layers disposed top and bottom of the hard mask. FIGS. 4A and 4B are micrographs of scanning electron microscopy (SEM) depicting that there is not an observed lifting phenomenon in the stack structure in accordance with the preferred embodiment.

On the basis of the preferred embodiment of the present invention, it is possible to prevent generation of defects in a semiconductor device caused by the above described lifting phenomenon by forming the hard mask with consideration of a tensile stress from the layers of the stack structure for forming the storage node contacts. This effect has further led to an effect of increasing reliability and yields of semiconductor devices and of providing stability to necessitated processes.

The present application contains subject matter related to the Korean patent application No. KR 2004-002305, filed in the Korean Patent Office on Jan. 13, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for forming a contact in a semiconductor device, comprising the steps of:
    forming a bit line on a substrate;
    forming an oxide layer made of high density plasma (HDP) oxide on a substrate structure including the bit line and the substrate;
    forming a hard mask on the oxide layer, wherein the hard mask is made of polysilicon; and
    performing an etching process for forming a storage node contact, wherein the etching process is performed after the bit line, the oxide layer and the hard mask are formed with a total stress intensity factor less than a critical value of a lifting phenomenon, the total stress intensity factor being determined by a thickness and a tensile stress of the bit line, the oxide layer and the hard mask layer.

2. The method of claim 1, wherein the bit line is formed by using tungsten.

3. The method of claim 2, wherein the bit line has a thickness ranging from approximately 300 Å to approximately 1000 Å.

4. The method of claim 1, wherein the step of forming the bit line further includes the step of forming a barrier metal layer with the use of Ti and TiN until the barrier metal has a thickness ranging from approximately 100 Å to approximately 1000 Å.

5. The method of claim 1, wherein the bit line is formed by performing an etching process using an etch gas of, $SF_6$, $BCL_3$, $N_2$, and $CL_2$ under a pressure ranging from approximately 20 mTorr to approximately 70 mTorr and a power ranging from approximately 300 W to approximately 1000 W.

6. The method of claim 1, further including the steps of: forming a nitride layer for forming a bit line hard mask on the bit line; and patterning the nitride layer.

7. The method of claim 6, wherein the nitride layer has a thickness ranging from 2000 Å to approximately 4000 Å.

8. The method of claim 6, wherein the nitride layer is patterned by using a gas of $CF_4$, $CHF_3$, $O_2$ and Ar along with a pressure ranging from approximately 20 mTorr to approximately 70 mTorr and a power ranging from approximately 300 W to approximately 1000 W.

9. The method of claim 1, wherein the hard mask is formed by performing an etching process using an etch gas of $C_2F_6$, HBr, $Cl_2$, Ar and He along with a pressure ranging from approximately 5 mTorr to approximately 20 mTorr and a power ranging from approximately 80 W to approximately 500 W.

10. The method of claim 1, wherein the etching process for forming the storage node contact proceeds by using an etch gas of $C_4F_8$, $C_5F_8$, $C_4F_6$, $CH_2F_2$, Ar, $O_2$, Co and $N_2$ along with a pressure ranging from approximately 15 mTorr to approximately 50 mTorr and a power ranging from 1000 W to approximately 2000 W.

11. The method of claim 1, after the step of performing the etching process for forming the storage node contact, further including the steps of:
    forming a spacer on lateral sides of a storage node contact hole;
    filling a storage node contact plug material into the storage node contact hole; and
    performing an etch-back process to the storage node contact plug material to thereby obtain a storage node contact plug.

12. The method of claim 11, wherein the spacer is made of low pressure nitride.

13. The method of claim 11, wherein the storage node contact plug material is polysilicon.

14. The method of claim 11, wherein the storage node contact plug material is formed with a thickness ranging from approximately 1500 Å to approximately 3000 Å.

15. The method of claim 11, wherein at the step of performing the etch-back process, the hard mask remaining in a cell region and a peripheral region is removed.

* * * * *